United States Patent [19]
Kolb

[11] Patent Number: 6,156,586
[45] Date of Patent: *Dec. 5, 2000

[54] METHOD FOR PRODUCING A MICROELECTRONIC SENSOR

[75] Inventor: Stefan Kolb, Unterschleissheim, Germany

[73] Assignee: Infineon Technologies AG, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/723,844

[22] Filed: Sep. 30, 1996

[30] Foreign Application Priority Data

Sep. 28, 1995 [DE] Germany ............................ 195 36 228

[51] Int. Cl.⁷ .......................... H01L 29/84; H01L 21/311
[52] U.S. Cl. ............................................. 438/52; 438/53
[58] Field of Search .................... 73/514.32, 514.36, 73/514.33, 514.29, 514.34, 862.382, 514.18, 514.21, 514.22, 514.23; 361/283; 438/52, FOR 432, FOR 438, 53, FOR 412; 148/DIG. 159, DIG. 73

[56] References Cited

U.S. PATENT DOCUMENTS

| | | | |
|---|---|---|---|
| 4,882,933 | 11/1989 | Petersen et al. ..................... | 73/514.33 |
| 5,121,633 | 6/1992 | Murakami et al. .................. | 73/514.36 |
| 5,157,472 | 10/1992 | Takemura .................................. | 357/26 |
| 5,181,156 | 1/1993 | Gutteridge et al. .................. | 73/514.32 |
| 5,231,879 | 8/1993 | Yamamoto ........................... | 73/514.36 |
| 5,241,864 | 9/1993 | Addie et al. . | |
| 5,258,097 | 11/1993 | Mastrangelo . | |
| 5,265,474 | 11/1993 | Chaffin et al. ....................... | 73/514.36 |
| 5,886,261 | 3/1999 | Mueller et al. ...................... | 73/514.36 |

FOREIGN PATENT DOCUMENTS

41 38 056 A1 5/1992 Germany .
43 32 843 A1 4/1995 Germany .
44 23 396 A1 1/1996 Germany .

OTHER PUBLICATIONS

"Tiny Accelerometer IC reaches High Sensitivity", (Richard Nass), Electronic Design, Sep. 22, 1988, pp. 170–171.

*Primary Examiner*—George Fourson
*Assistant Examiner*—Barbara Elizabeth Abbott
*Attorney, Agent, or Firm*—Herbert L. Lerner; Laurence A. Greenberg; Werner H. Stemere

[57] ABSTRACT

The invention relates to a microelectronic integrated sensor, in which a cantilever is formed. To avoid mechanical stress during the production process, the cantilever is disposed freely movably in the sensor. To that end, a support for retaining the cantilever and lateral and upper motion limiters are provided, which prevent the cantilever from slipping off the support. The invention also relates to a method for producing such a sensor.

3 Claims, 3 Drawing Sheets

METHOD FOR PRODUCING A MICROELECTRONIC SENSOR

BACKGROUND OF THE INVENTION

Field of the Invention

The invention relates to a microelectronic integrated sensor, in which a cantilever is formed. The invention also relates to a method for producing the sensor.

Such sensors are used for instance as acceleration measuring sensors. The cantilever, together with a further face surface, acts as a capacitor, and changes in capacitance are evaluated as a measured variable. Typically, the formerly known cantilevers are firmly anchored in the sensor via a spring during the entire production process. Certain manufacturing processes in the production of the sensor lead to stress, and particularly mechanical stress, in the cantilever. If the springs do not relax completely, the cantilever can sag as a result. Moreover, the forces absorbed in the springs can cause incorrect behavior of the cantilever during operation.

SUMMARY OF THE INVENTION

It is accordingly an object of the invention to provide a microelectronic integrated sensor and method for producing the sensor, which overcomes the above-mentioned disadvantages of the heretofore-known devices and methods of this general type and which is not vulnerable to mechanical strain, especially during the production process, and as a result it functions especially reliably overall. A method for producing the sensor of the invention is also to be provided.

With the foregoing and other objects in view there is provided, in accordance with the invention, a microelectronic integrated sensor, comprising: a sensor housing defining a hollow chamber therein; a support disposed in the hollow chamber, and a cantilever with an edge disposed on the support; lateral and upper motion limiters disposed in the hollow chamber, the motion limiters being spaced apart from the edge of the cantilever so as to allow adequate compensatory motions of the cantilever for reducing mechanical stress thereon, and to enable the compensatory motions only at the support.

With the above and other objects in view there is also provided, in accordance with the invention, a method of producing a microelectronic integrated sensor of the type having a cantilever disposed in a hollow chamber, the method which comprises: forming a first oxide layer on a substrate, the first oxide defining a starting basis for creating a support for the cantilever; depositing a second oxide layer on the first oxide layer, the second oxide layer having a relatively higher etching rate than the first oxide layer; depositing thereon, doping, and recrystallizing a first polysilicon layer for forming the cantilever; forming an array of holes in the first polysilicon layer for later isotropic etching of the first and second oxide layers; applying a third oxide layer having an etching rate similar to the etching rate of the second oxide layer, the second and third oxide layers together forming a lateral motion limiter for limiting a lateral movement of the cantilever; depositing a layer of material having a relatively lower etching rate than the second and third oxide layers, the layer of material forming an upper motion limiter for limiting an upward motion of the cantilever; applying a second polysilicon layer for forming a cap; structuring an array of holes in the second polysilicon layer for admitting therethrough an etchant; and performing an isotropic oxide etching step for forming the hollow chamber for the cantilever.

It is an essential concept of the invention that the cantilever is placed on a support; that lateral and upper motion limiters are present, which are spaced apart from one edge of the cantilever in such a way that on the one hand adequate compensatory motions of the cantilever are possible in order to reduce mechanical stress, and on the other the compensatory motions are possible only in the region of the support.

In this way, a completely and freely relaxable cantilever is created, which is placed on the support, such as bearing points, on which it can move substantially freely and is limited laterally and from above in its motion so far that displacement or slipping beyond the supporting bearing points is prevented.

The support and the motion limiter can favorably also be embodied as a unit; preferably, a receptacle that surrounds the outer edge of the cantilever is provided. It can also be said that the cantilever is received in a slit or in a groove or, alternatively, in a blind bore. The motion limiters and the support or more especially the bearing points are preferably provided in the entire circumferential region of the cantilever. It is equally possible for both of them, or only the bearing points, or only the motion limiters, to be disposed in point form at individual points of the cantilever.

In accordance with a preferred feature of the invention, the motion limiter is in the form of a pillar or a prop, which is guided by a recess formed in the cantilever. The motion limiter in this case accordingly does not engage the outer edge of the cantilever but rather the edge of the cantilever formed in the receptacle.

With the above and other objects in view, the method for producing the sensor with a cantilever in a hollow chamber includes, as an essential step of the invention, the creation of a first oxide, which serves as a starting basis for creating the bearing points, on a substrate; over it, a second oxide layer is deposited, which has a higher etching rate than the first oxide layer; a first polysilicon layer for forming the cantilever is deposited, doped and recrystallized; an array of holes is structured in the first polysilicon layer and serves to pass through the oxide etching performed at the end of the process sequence; a third oxide layer with an etching rate similar to the second oxide layer is applied, the second and third oxide layers acting as a basis for the creation of a lateral motion limiter; a further layer of material is applied with an etching rate that is lower than the etching rate of the second and third oxide layers; a second polysilicon layer for forming a cap is applied; an array of holes is structured in the second polysilicon layer, and through this array of holes an isotropic etching of the last-applied material layer and of the third, second and first oxide layer is performed to form the hollow chamber or void.

By this method, cantilever is formed in a void inside a sensor; on a support point formed out of a first oxide layer, the cantilever is held, movable within a predetermined range, by lateral motion limiters formed out of the second and third oxide layers and by an upper motion limiter formed out of the upper material layer.

In the method, the first oxide is preferably formed by a LOCOS technique, or in other words as a thermal oxide. The second and third oxide layers are advantageously a deposited oxide that can for instance be formed of TEOS. The layer of material applied over that, in a preferred embodiment, comprises boron phosphorus silicate glass (BPSG).

During the oxide etching to form the void, the possibility exists that the cantilever, formed out of the first polysilicon layer or a silicon layer, will stick fast by suction to the support or some other face in cooperation with the etching liquid. For this reason it is advantageous during the production process to provide pillars made of resist, which can be formed in a simple way by a two-stage creation of the array of holes in the second polysilicon layer.

With a first phototechnique, some holes are structured and resist pillars are then formed in them. In these holes, an anisotropic etching is first performed with a partially isotropic component. To create the other holes in the array of holes in the second polysilicon layer, a resist mask is applied, which leaves only those holes that are now to be created free and is therefore also applied in the region of the holes first created. The previously etched voids fill with resist in the process and because of the isotropic component of the first etching, they also engage the first polysilicon layer from beneath. To form these resist pillars, it is necessary that holes used form them in the array of holes of the first polysilicon layer essentially match the holes of the second polysilicon layer.

Other features which are considered as characteristic for the invention are set forth in the appended claims.

Although the invention is illustrated and described herein as embodied in a microelectronic integrated sensor and method for producing the sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
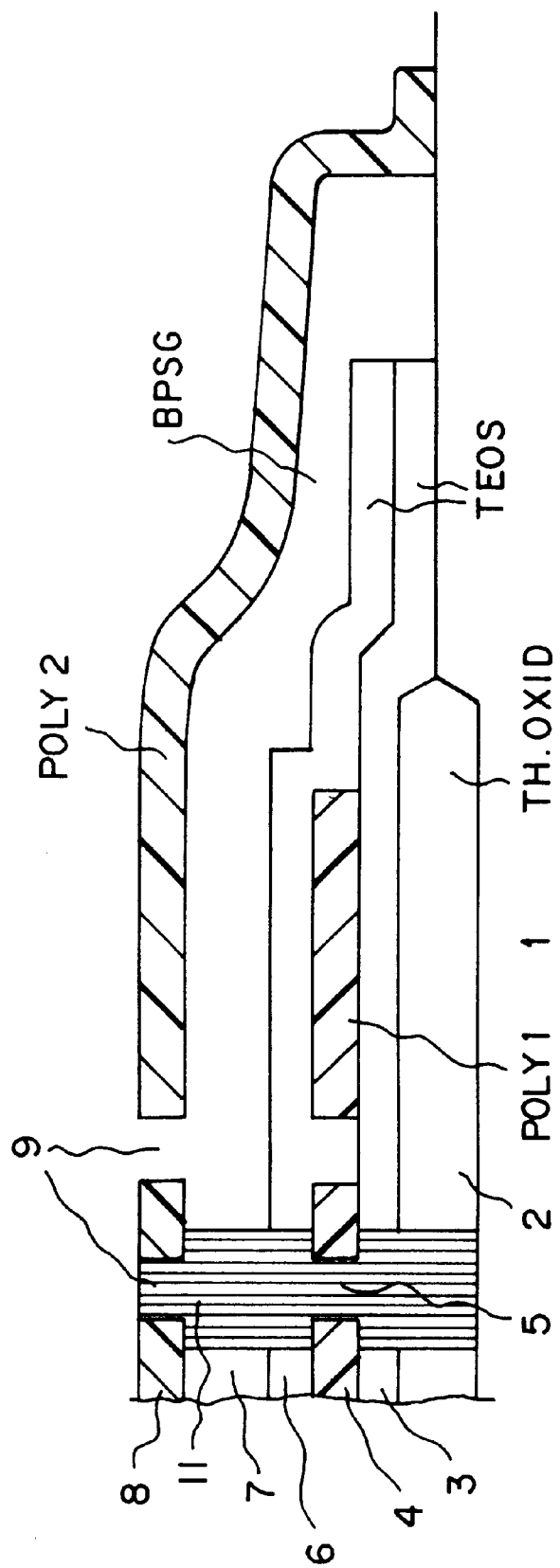
FIG. 1 is a schematic vertical section through a microelectronic sensor with a cantilever during the production process.
Figure 2:
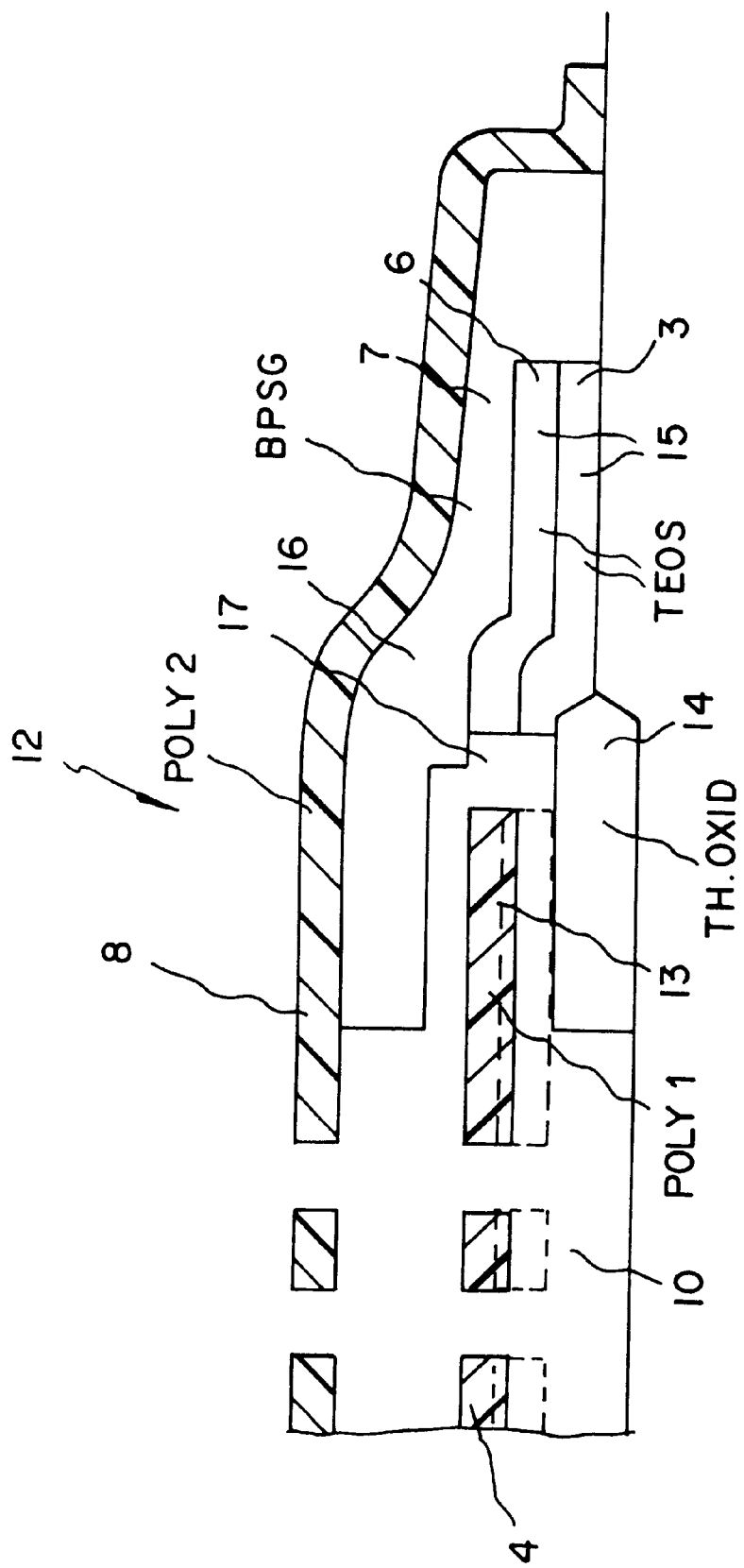
FIG. 2 is a similar view of the microelectronic sensor towards the end of the production process.

Referring now to the figures of the drawing in detail and first, particularly, to FIG. 1 thereof, there are seen various material layers which are applied and structured during the various method steps. Beginning with a substrate 1, a thermal oxide is created by a LOCOS technique. It is structured by a first phototechnique. Over it, by application of a tetraethyl oxysilicate layer (TEOS layer), an oxide for forming a second oxide layer 3 is deposited. This oxide is structured by a second phototechnique. Care must be taken that this second oxide layer of deposited oxide have a higher etching rate than the first oxide layer 2 of thermal oxide located beneath it. Over that, a first polysilicon layer 4 is deposited, which serves to form a cantilever. This polysilicon layer 4 is then doped and, with the aid of a high-temperature treatment, recrystallized, in the course of which dopant activation is carried out. With the aid of a third phototechnique, this polysilicon layer 4 is structured; first, precisely as in the other layers as well, definition and structuring of the outer dimensions takes place, and second, an array of holes 5 is created in the polysilicon layer. The holes thus produced later serve to carry the etching liquid for oxide etching into the oxide layers 2 and 3 located under the polysilicon layer 4. In the next step, a TEOS coating is applied for oxide deposition. The third oxide layer 6 is structured by a fourth phototechnique to define its outer dimensions. The oxide liquid fills up the holes 5 previously created in the first polysilicon layer. The second oxide layer 3 and the third oxide layer 6 comprise the same material and therefore have the same etching rate, which is higher than that of the first oxide layer 1. In the next step, a layer 7 of material is applied that has a lower etching rate than the second and third oxide layers. Boron phosphorus silicate glass is used here for this. Next, a densification step is performed and thus simultaneously a planarizing effect is attained. Over the BPSG layer 7, a second polysilicon layer 8 is applied, which serves to cover the sensor. This polysilicon layer 8 is doped, recrystallized, again with a high-temperature process, and the dopants present are activated. In the ensuing photo technique for structuring the polysilicon layer 8 first the outer dimensions of the sensor are defined and second some holes in the array of holes 9 are already created, in which resist pillars are to be disposed. The polysilicon is etched at the points bared by the mask, which substantially match holes in the underlying first polysilicon layer 4. With a dry, anisotropic oxide etching with an isotropic component, a hole extending down as far as the substrate 1 is created in the sensor; it is substantially vertical and engages the polysilicon layers 4 and 8 from beneath in the region of the etching hole. By a second phototechnique, the other holes of the array of holes 9 are created in the second polysilicon layer 8. To that end, first an appropriate resist mask is applied, which also covers the holes in the second polysilicon layer 8 that were created by the previous phototechnique. The holes created in the previous etching step are filled with resist in this process, so that resist pillars 11 form inside the sensor. A wet isotropic oxide etching is then performed through the other open holes in the second polysilicon layer 8; because of the different etching rates of the oxide layers 2, 3 and 6 and of the BPSG layer 7 located above them, a void 10 is created, which is shown in FIG. 2. By means of the resist pillar 11, the first polysilicon layer 4 that forms the cantilever is held above the thermal oxide 2 forming the support, and sticking by suction during the etching process is prevented.

Next, the resist pillar 11 is removed. This state of the method is shown in FIG. 2. In the next step, the array of holes in the second polysilicon layer is closed again as are portions of the BPSG layer 7. In the region of the arrow 12, by a phototechnique, a contact hole is structured, and then the contact hole etching is done. Through this contact hole, metallizing is performed for contacting the cantilever. Accordingly, by this method, a sensor has been created whose cantilever 13 rests on a bearing point 14 and is supported by it. The dashed line in FIG. 2 illustrates a position of the cantilever resting on the bearing point or support 14. Lateral slipping of the cantilever 13 is prevented by lateral motion limiters 15, which must be disposed on a plurality of sides of the cantilever 13. Moreover, upper motion limiters 16 are provided to prevent canting. The lateral and upper motion limiters 15, 16 together with the bearing point or support 14 define a receptacle in the form of a blind bore 17 or slit 17. The sensor can now function as intended, as a result of the varying capacitances between the cantilever and the polysilicon layer 8 on the one hand and the cantilever and the substrate 1 on the other. Since the bearing point 14 and the lateral motion limiters 15 comprise oxide and the upper motion limiter 16 comprises BPSG, the cantilever is supported in a manner that is electrically insulated from the substrate 1 and the second polysilicon layer 8.

Figure 3:
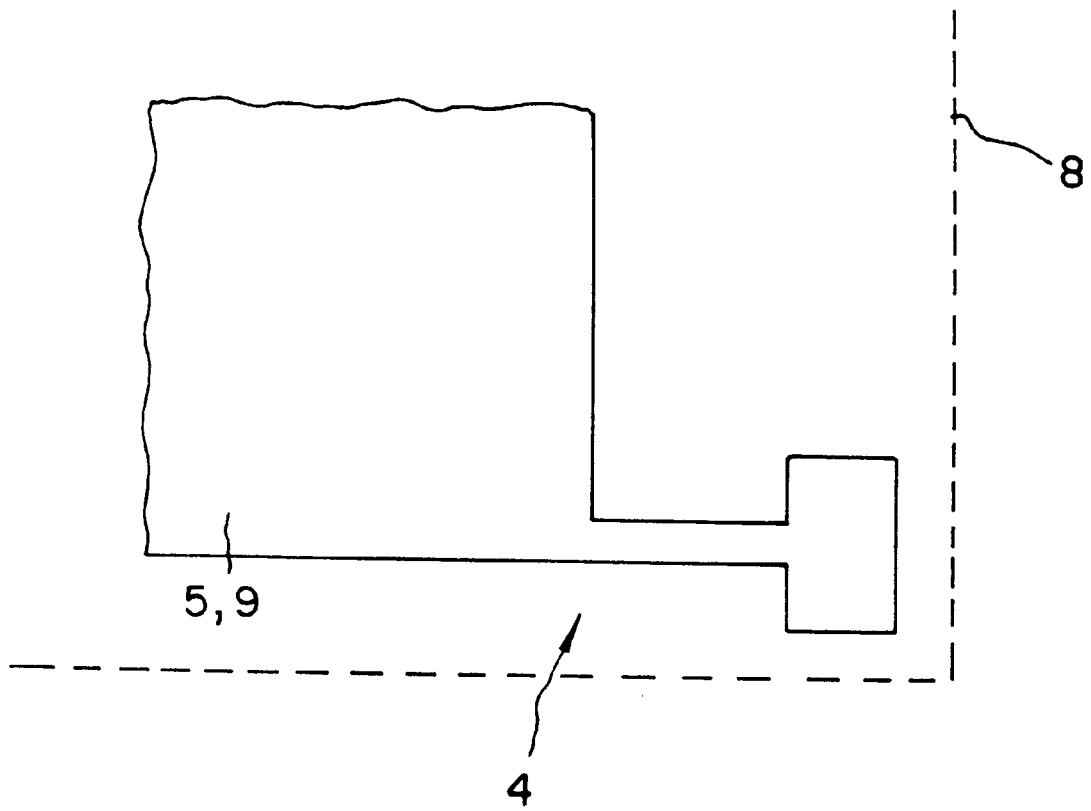
FIG. 3 is a schematic plan view, partly in section, onto the microelectronic sensor.

FIG. 3 shows a plan view on a sensor; the outer dashed line indicates the outer dimensions that are determined by the second polysilicon layer 8. That layer acts as a cap and rests above the cantilever line beneath it. The continuous line shows the dimensions of the first polysilicon layer 4, in whose center region the array of holes 5 is formed. Located precisely above it is also the array of holes 9 of the second polysilicon layer 8. The support points and motion limiters are disposed in the continuation of the cantilever at the lower right, but they may also be disposed directly at the edge.

In some applications, the upper covering is unnecessary, so in these cases the cantilever is directly accessible from outside and merely represents a kind of plate above a void.

Such embodiments may be used as pressure sensors, for example.

I claim:

1. A method of producing a microelectronic integrated sensor of the type having a cantilever disposed in a hollow chamber, the method which comprises:

forming a first oxide layer on a substrate, the first oxide defining a starting basis for creating a support for the cantilever;

depositing a second oxide layer on the first oxide layer, the second oxide layer having a relatively higher etching rate than the first oxide layer;

depositing thereon, doping, and recrystallizing a first polysilicon layer for forming the cantilever;

forming an array of holes in the first polysilicon layer for later isotropic etching of the first and second oxide layers;

applying a third oxide layer having an etching rate essentially equal to the etching rate of the second oxide layer, the second and third oxide layers together forming a lateral motion limiter for limiting a lateral movement of the cantilever;

depositing a layer of material having a relatively lower etching rate than the second and third oxide layers, the layer of material forming an upper motion limiter for limiting an upward motion of the cantilever;

applying a second polysilicon layer for forming a cap; structuring an array of holes in the second polysilicon layer for admitting therethrough an etchant; and performing the isotropic oxide etching step for forming the hollow chamber for the cantilever.

2. The method according to claim 1, wherein the step of forming the first oxide layer comprises creating a thermal oxide with a LOCOS technique; the steps of forming the second and third oxide layers comprise depositing by TEOS deposition, and the method further comprises depositing, as further material over the second and third oxide layers, a boron phosphorous silicate glass layer.

3. The method according to claim 1, wherein the step of structuring the array of holes in the second polysilicon layer comrises a first partial step of performing anisotropic oxide etching with an isotropic component after etching the first holes, and a second partial step of filling the voids created in the first partial step with resist when resist is applied for structuring the second holes and thereby forming resist pillars.

* * * * *